United States Patent [19]
Katsuyama et al.

[11] Patent Number: 5,518,579
[45] Date of Patent: May 21, 1996

[54] METHOD FOR FORMING A FINE PATTERN

[75] Inventors: Akiko Katsuyama; Masaru Sasago; Kazuhiro Yamashita, all of Osaka, Japan

[73] Assignee: Matsushita Electric Industrial Co., Ltd., Osaka, Japan

[21] Appl. No.: 373,776

[22] Filed: Jan. 17, 1995

[30] Foreign Application Priority Data

Jan. 18, 1994 [JP] Japan ..................... 6-003463

[51] Int. Cl.⁶ .................................................. H01L 21/00
[52] U.S. Cl. ..................... 156/659.11; 156/655.1; 216/41; 430/270.1; 430/313; 437/229
[58] Field of Search ............... 156/659.11, 661.11, 156/662.1, 655.1; 216/41; 437/229; 430/269, 270, 272, 313, 318

[56] References Cited

U.S. PATENT DOCUMENTS 5,123,998  6/1992  Kishimura ................. 156/643.1
5,219,788  6/1993  Abernathey et al. .
5,275,689  1/1994  Felten et al. .

FOREIGN PATENT DOCUMENTS 63-90832  4/1988  Japan .

*Primary Examiner*—William Powell
*Attorney, Agent, or Firm*—Willian Brinks Hofer Gilson & Lione

[57] ABSTRACT

An acid solution is fed onto a TiN film formed on a semiconductor substrate. So, the TiN film is dipped into the acid solution, whereupon the surface of the semiconductor substrate is neutralized or is made less basic. Then, a chemically amplified resist, containing an acid generator which produces an acid when irradiated with radiant rays and a compound reactive to acids, is applied to the semiconductor substrate, to form a resist film. This is followed by a step for sending radiant rays upon the resist film to expose it. Then, the exposed resist pattern is developed to form a resist pattern without footing or scumming and undercutting.

19 Claims, 4 Drawing Sheets

METHOD FOR FORMING A FINE PATTERN

BACKGROUND OF THE INVENTION

This invention pertains to a method for forming a fine pattern for use in formation of semiconductor devices and integrated circuits on a semiconductor substrate.

Recently, various fine-pattern formation methods have been used in the field of IC and LSI production. As miniaturization in process dimensions has progressed, a process making use of a shortwave light source has been considered one of the most important fine-pattern formation techniques. In a lithography process with the aid of a shortwave light source, a chemically amplified resist is generally used. A chemically amplified resist is composed of a multi-component material containing an acid generator capable of producing acid upon exposure to radiant ray and a compound reactive to acid. Acid catalytic reaction is utilized to change alkali solubilities, whereupon a fine-pattern is formed.

Referring now to FIGS. 4a and 4b, a conventional fine-pattern formation technique will be described below.

As shown in FIG. 4a, TiN film 2 is formed on top of semiconductor substrate 1. TiN film 2 has a basic surface because of the existence of basic substance 3 thereon.

Next, a chemically amplified resist of positive type, e.g., WKR-PT-2 manufactured by Wako Pure Chemical Industries Ltd., is applied to TiN film 2 to form a resist film 4. An exposure step through mask 5, a post-exposure baking step, and a development step are performed on resist film 4 to form resist pattern 6 shown in FIG. 4b.

The aforesaid fine-pattern formation technique, however, suffers from some problems. For example, the phenomenon of footing or scumming occurs so that resist pattern 6 results in having a spread-out bottom. In other words, resist pattern 6 is damaged. Use of a chemically amplified resist of positive type creates such footing or scumming to a resultant resist pattern. On the other hand, use of a chemically amplified resist of negative type creates the phenomenon of under-cutting so that resist pattern 6 results in having an inwardly tapered bottom. As a result, resist patterns formed by a chemically amplified resist will have a deteriorated form and will provide poor resolution. This ill-affects subsequent steps.

The above-described problem becomes more serious especially when forming a resist pattern on a basic semiconductor substrate covered with a TiN film or SiN film. However, such a problem may be produced even to a non-basic semiconductor substrate.

U.S. Pat. No. 5,219,788 tries to provide a solution to the aforesaid problem by forming a thin film on top of a semiconductor substrate and then forming a resist pattern on the thin film with a chemically amplified resist.

Another method of washing a semiconductor substrate surface with a solution of acid to get rid of surface contaminants has been used widely.

U.S. Pat. No. 5,219,788 still has the drawback that the process becomes complicated thereby increasing the production cost.

The latter method, too, still has the drawback that it cannot perfectly prevent the occurrence of footing or scumming and under-cutting. It is difficult for this method to prevent the occurrence of footing or scumming and under-cutting for the case of a basic semiconductor substrate with its surface covered with a TiN or SiN film.

SUMMARY OF THE INVENTION

Bearing in mind the above-described problems associated with the prior art techniques, the present invention was made. Accordingly, it is an object of the present invention to provide an improved fine-pattern formation method capable of completely preventing the occurrence of footing or scumming and under-cutting to a resist pattern of a chemically amplified resist formed on a usual semiconductor substrate or on a basic semiconductor substrate.

The causes of the aforesaid problems were carefully reviewed, and the following were found. Although an acid generator contained in a chemically amplified resist produces acid when exposed to radiant ray, the produced acid is neutralized by a basic substance that exists in the surface of a TiN film. As a result, in the TiN film surface, it is difficult for the generated acid to contribute to the reaction of a compound that reacts with acid. This results in the occurrence of footing or scumming and under-cutting, so that it is impossible to obtain a targeted resist pattern. In a semiconductor substrate surface with such a deteriorated resist pattern on it, there exists a basic substance, e.g., ammonia, or the concentration of the lone pair of electrons of nitrogen atoms forming the uppermost surface of a TiN film is high, so that these substances use up the generated acid in the vicinity of the semiconductor substrate surface. As a result, a resist pattern formed by a chemically amplified resist will have a deteriorated form and will provide poor resolution.

The above-described problem becomes more serious especially when forming a resist pattern on a basic semiconductor substrate that is covered with a TiN film or SiN film. However, these problems may be produced even to a non-basic semiconductor substrate. This may be explained as follows. Since a chemically amplified resist is likely to be affected by environmental impurities, this prevents the reaction of an acid-reactive compound. As a result, footing or sucmming and under-cutting occur. Therefore, a resultant resist pattern has a deteriorated form and provides poor resolution.

The present invention was made based upon the above-described knowledge. In the present invention, the supply of acid is made to a semiconductor substrate surface, so that the reaction of the compound that reacts with acid is promoted.

The present invention provides a first method for forming a fine pattern comprising:

a first step for feeding an acid solution onto a semiconductor substrate;

a second step for coating the semiconductor substrate with a chemically amplified resist containing an acid generator which produces an acid when irradiated with radiant rays, and a compound reactive to acid, to form a resist film;

a third step for sending radiant rays upon the resist film to expose same; and a fourth step for developing the exposed resist film to form a resist pattern.

The aspect of the first fine-patten formation method of the present invention is as follows. When sending radiant ray upon the resist film, both the acid, produced from the acid generator contained in the chemically amplified resist, and the acid, contained in the acid solution, contribute to the reaction of the acid-reactive compound in the vicinity of an interface between the resist film and the semiconductor substrate. This prevents the deactivation of the acid produced from the acid generator. As a result, the progressing rate of the reaction of the acid-reactive compound is equalized in all directions, thereby providing an adequate resist pattern with perpendicular sides.

In the first fine-pattern formation method, it is preferable that the first step includes a step in which a solution of an acid generator capable of producing an acid when irradiated with radiant rays or when heated is irradiated with radiant rays or heated to produce an acid for transforming the acid generator solution into an acid solution while at the same time feeding the acid solution onto the semiconductor substrate. As a result, the supply of an acid solution onto a semiconductor substrate is easily and positively carried out.

It is preferable that the acid solution in said first step of the first fine-pattern formation method contains at least one of organocarboxylic acid, organocarboxylic acid anhydride, organodicarboxylic acid, and organosulfonic acid.

The present invention provides a second method for forming a fine pattern comprising:

a first step for feeding an acid generator solution containing an acid generator capable of producing an acid when irradiated with radiant rays, onto a semiconductor substrate;

a second step for coating the semiconductor substrate with a chemically amplified resist containing an acid generator which produces an acid when irradiated with radiant rays, and a compound reactive to acid, to form a resist film;

a third step for sending radiant rays upon the resist film for causing the acid generator contained in the acid generator solution to produce an acid and exposing the resist film; and a fourth step for developing the exposed resist film to form a resist pattern.

The aspect of the second fine-patten formation method of the present invention is as follows. The resist film is irradiated with radiant ray, whereupon the acid generator contained in the acid generator solution produces acid. Both the acid, produced from the acid generator contained in the chemically amplified resist, and the acid, produced from the acid generator, contained in the acid generator solution, contribute to the reaction of the acid-reactive compound. This prevents the deactivation of the acid produced from the acid generator contained in the chemically amplified resist. As in the first fine-pattern formation method, the second fine-pattern formation method can provide an adequate resist pattern with perpendicular sides.

It is preferable that second fine-pattern formation method further comprises a step between the first step and the second step in which the acid generator contained in the acid generator solution is irradiated with radiant rays to produce an acid.

The aspect of the above-described arrangement is as follows. Acid is already present in an interfacial area of the semiconductor substrate in relation to the resist film, therefore enabling the resist film to be formed on the semiconductor substrate which has been neutralized or made less basic by the acid solution. This further promotes the reaction of the acid-reactive compound taking place at the interface between the resist film and the semiconductor substrate.

It is preferable that, in the second fine-pattern formation method, the acid generator in the first step is capable of producing an acid when heated and a step is provided between the second step and the third step or between the third step and the fourth step in which the semiconductor substrate is heated so that the acid generator contained in the acid generator solution produces an acid and the resist film is baked.

Such arrangement enables the acid generator, contained in the acid generator solution, to generate acid in the prebaking step or in the post-exposure baking step. This further promotes the reaction of the acid-reactive compound occurring at an interfacial area of the semiconductor substrate in relation to the resist film. In this case, it is possible to heat the acid generator contained in the acid generator solution in the prebaking step or in the post-exposure baking step, thereby eliminating the need for providing a heating step for heating the acid generator.

The present invention provides a third method for forming a fine pattern comprising:

a first step for feeding an acid generator solution containing an acid generator capable of producing an acid when heated, onto a semiconductor substrate;

a second step for coating the semiconductor substrate with a chemically amplified resist containing an acid generator which produces an acid when irradiated with radiant rays, and a compound reactive to acid, to form a resist film;

a third step for heating the semiconductor substrate to cause the acid generator contained in the acid generator solution to produce an acid and to bake the resist film;

a fourth step for sending radiant rays upon the baked resist film to expose same; and a fifth step for developing the exposed resist film to form a resist pattern.

The aspect of the third fine-patten formation method of the present invention is as follows. The semiconductor substrate is prebaked, whereupon the acid generator contained in the acid generator solution produces acid. Both the acid, produced from the acid generator contained in the chemically amplified resist, and the acid, produced from the acid generator contained in the acid generator solution, contribute to the reaction of the acid-reactive compound. This prevents the deactivation of the acid produced from the acid generator contained in the chemically amplified resist. As in the first fine-pattern formation method, the second fine-pattern formation method can provide an adequate resist pattern with perpendicular sides.

The present invention provides a fourth method for forming a fine pattern comprising:

a first step for feeding an acid generation solution containing an acid generator capable of producing an acid when heated, onto a semiconductor substrate;

a second step for coating the semiconductor substrate with a chemically amplified resist containing an acid generator which produces an acid when irradiated with radiant rays, and a compound reactive to acid, to form a resist film;

a third step for sending radiant rays upon the resist film to expose same;

a fourth step for heating the semiconductor substrate to cause the acid generator contained in the acid generator solution to produce an acid and to bake the resist film; and a fifth step for developing the baked resist film to form a resist pattern.

The aspect of the fourth fine-patten formation method of the present invention is as follows. The semiconductor substrate is subject to a post-exposure baking process, whereupon the acid generator, contained in the acid generator solution, produces acid. Both the acid, produced from the acid generator contained in the chemically amplified resist, and the acid, produced from the acid generator contained in the acid generator solution, contribute to the reaction of the acid-reactive compound. As in the first fine-pattern formation method, the fourth fine-pattern formation method can provide an adequate resist pattern with perpendicular sides.

It is preferable that in the third or fourth fine-pattern formation method a step is provided between the first step and the second step in which the semiconductor substrate is heated so that the acid generator contained in the acid generator solution produces an acid.

The aspect of the above-described arrangement is as follows. Acid is already present in an interfacial area of the semiconductor substrate in relation to the resist film, therefore enabling the resist film to be formed on the semiconductor substrate which has been neutralized or made less basic by the acid solution. This further promotes the reaction of the acid-reactive compound taking place at the interface between the resist film and the semiconductor substrate.

It is preferable that in the second to fourth fine-pattern formation methods the acid generator solution in the first step further contains an acid compound.

The aspect of the above-described arrangement is as follows. Acid is already present in an interfacial area of the semiconductor substrate in relation to the resist film, therefore enabling the resist film to be formed on the semiconductor substrate which has been neutralized or made less basic by the acid compound. This further promotes the reaction of the acid-reactive compound taking place at the interface between the resist film and the semiconductor substrate.

In the first to fourth fine-pattern formation method, a basic film may be formed on a surface of the semiconductor substrate in the first step. The aspect of the above-described arrangement is as follows. Since the semiconductor substrate has been neutralized or made less basic, this makes it possible to form an adequate resist pattern with perpendicular sides.

The present invention provides a fifth fine-pattern formation method comprising:

a first step for feeding an acid solution onto a semiconductor substrate with a basic surface;

a second step for feeding an acid generator solution containing an acid generator capable of producing an acid when irradiated with radiant rays, onto the semiconductor substrate;

a third step for coating the semiconductor substrate with a chemically amplified resist containing an acid generator which produces an acid when irradiated with radiant rays, and a compound reactive to acid, to form a resist film;

a fourth step for sending radiant rays upon the resist film for causing the acid generator contained in the acid generator solution to produce an acid and exposing the resist film; and a fifth step for developing the exposed resist film to form a resist pattern.

The aspect of the fifth fine-pattern formation method is as follows. The resist film is formed on the semiconductor substrate which has been neutralized or made less basic by the acid solution. The resist film is irradiated with radiant ray, whereupon the acid generator, contained in the acid generator solution, produces acid. Both the acid, produced from the acid generator contained in the chemically amplified resist, and the acid, produced from the acid generator contained in the acid generator solution, contribute to the reaction of the acid-reactive compound. As in the first fine-pattern formation method, the fifth fine-pattern formation method can provide an adequate resist pattern with perpendicular sides.

It is preferable that in the fifth fine-pattern formation method the acid generator in the second step is capable of producing an acid when heated and a step is provided between the third step and the fourth step or between the fourth step and the fifth step in which the semiconductor substrate is heated so that the acid generator contained in the acid generator solution produces an acid and the resist film is baked.

Such arrangement enables the acid generator, contained in the acid generator solution, to generate acid in the prebaking step or in the post-exposure baking step. This further promotes the reaction of the acid-reactive compound occurring at an interfacial area of the semiconductor substrate in relation to the resist film. In this case, it is possible to heat the acid generator contained in the acid generator solution in the prebaking step or in the post-exposure baking step, thereby eliminating the need for providing a heating step for heating the acid generator.

Unlike a fine-pattern formation method in which a thin film is sandwiched between the resist film and the semiconductor substrate, the fine-pattern formation method of the present invention can be performed using a conventional applicator. This cuts down production costs.

The following may be used as an acid compound present in the acid solution to be fed to the semiconductor substrate surface: (i) carboxylic acid or carboxylic anhydride, e.g., formic acid, acetic acid, propionic acid, acrylic acid, butyric acid, isobutyric acid, methacrylic acid, oleic acid, lactic acid, monochloroacetic acid, dichloroacetic acid, trichloroacetic acid, trifluoroacetic acid, oxalic acid, malonic acid, acetic anhydride, and propionic anhydride and (ii) sulfonic acid, e.g., methanesulfonic acid, ethanesulfonic acid, propanesulfonic acid, butanesulfonic acid, p-toluenesulfonic acid, and benzenesulfonic acid.

The following may be used as an acid generator contained in the acid generator solution capable of producing acid when exposed to light or when heated: diphenyldisulfone, triphenylsulfonium trifluoromethanesulfonate, diphenyliodonium trifluoromethanesulfonate, bis(p-toluenesulfonyl)diazomethane, bis(p-chlorbenzenesulfonyl)diazomethane, 1,2,3-tris(methanesulfonyloxy)benzene, 1,3,5-tris(trifluoromethanesulfonyloxy)benzene, p-toluenesulfonic acid o-nitrobenzyl, p-toluenesulfonic acid 2,6-dinitrobenzil, 1,1-bis(p-chlorophenyl)-2,2,2-trichloroethane, bis(ter-butylsulfonyl)diazomethane, biscyclohexylsulfonyldiazomethane, 1,1-bis(p-chlorophenyl)-2,2,-dichloroethane, 2-chloro-6-(trichloromethyl)pyridine, diphenyl-p-methylphenacylsulfonium p-toluenesulfonate, diphenyl-2,5-dimethoxyphenacylsulfonium p-toluenesulfonate, and 2-methyl-2-p-toluenesulfonylpropiophenone. It is to be noted that other functionally equivalent acid generators may be useful.

The following may be used as a solvent for the aforesaid acid compound and acid generator: methyl Cellosolve acetate, ethyl Cellosolve acetate, propylene glycol monomethyl ether acetate, propylene glycol monoethyl ether acetate, methyl lactate, ethyl lactate, methyl pyruvate, ethyl pyruvate, 2-ethoxyethyl acetate, butyl acetate, isopropanol, 2-methoxypropanol, ethylene glycol, propylene glycol, 3-methoxy methyl propionate, 3-methoxy ethyl propionate, 2-heptanone, and diethylene glycol dimethylether.

As the concentration of the acid solution, any concentration may be used as long as the acid compound or acid generator is dissolved. Generally, it should be 0.1 to 50 wt %, preferably 0.5 to 25 wt %.

DETAILED DESCRIPTION OF THE INVENTION

Preferred embodiments of the present invention will now be described below by reference to the accompanying drawing figures.

EMBODIMENT 1

Referring to FIGS. 1a–e, a fine-pattern formation method of the first preferred embodiment is described. The first fine-pattern formation method is directed to a method in which a fine pattern is formed over semiconductor substrate 1 with TiN film 2 on its surface.

Figure 1A:
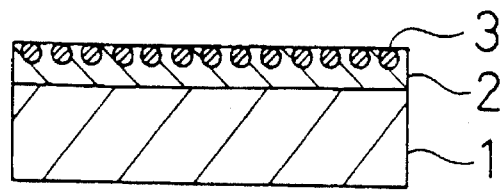
FIGS. 1a–e show in cross section steps of the fine-pattern formation method according to the first to eighth embodiments of the present invention.

As shown in FIG. 1a, TiN film 2 is formed on semiconductor substrate 1. In TiN film 2, a great many lone pairs of electrons of nitrogen atoms are present and the surface concentration of ammonia is high. Therefore, the surface of TiN film 2 is basic. In other words, a base 3 is present in the surface of TiN film 2.

Figure 1B:
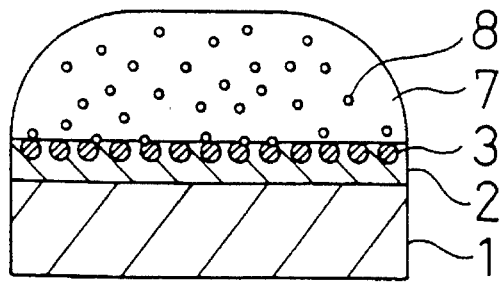

Acid solution 7, i.e., 20 percent by weight of a dichloroacetic acid solution, is prepared by dissolving dichloroacetic acid in ethyl lactate. As shown in FIG. 1b, acid solution 7 thus prepared is drip-fed onto semiconductor substrate 1, so that the entire surface of semiconductor substrate 1 is dipped into acid solution 7 for 20 seconds. Thereafter, acid solution 7 is spin-dried, and the base 3 present in TiN film's 2 surfac is neutralized by an acid 8 present in acid solution 7. As a result, TiN film 2 with its surface neutralized is obtained.

Figure 1C:
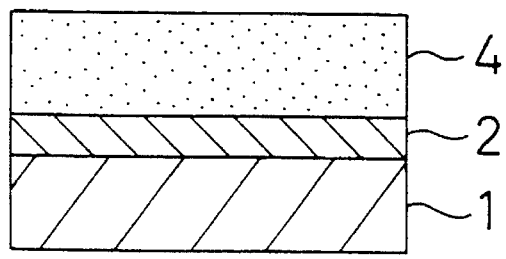

Next, as shown in FIG. 1c, a two-component chemically amplified resist 4 of positive type, e.g., WKR-PT-2 manufactured by Wako Pure Chemical Industries Ltd., is spin-applied onto TiN film 2. Then, a prebaking process is carried out for 90 seconds at a temperature of 90° C. to form resist film 4.

Figure 1D:
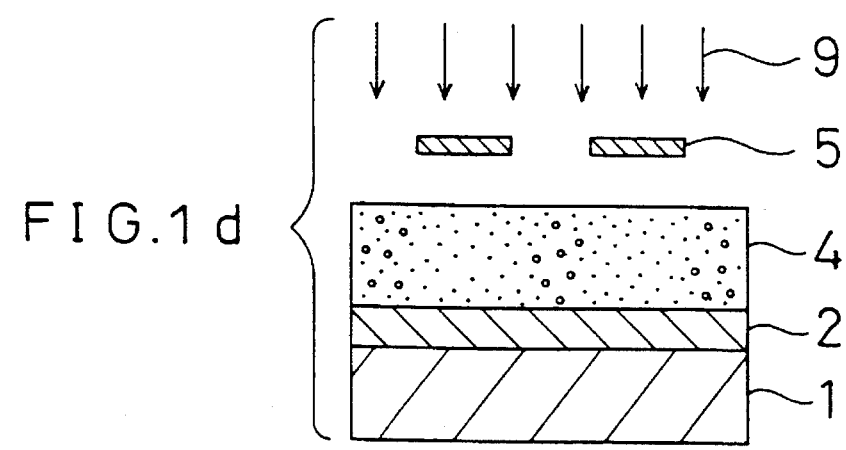
Figure 1E:
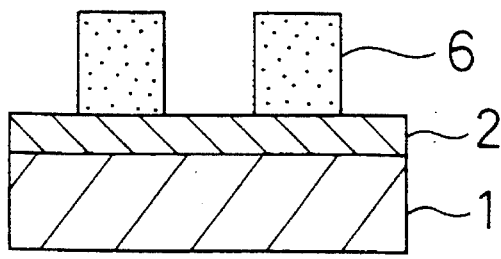

Next, as shown in FIG. 1d, resist film 4 is exposed to KrF excimer laser 9 through mask 5. This is followed by a post-exposure baking process for 90 seconds at a temperature of 100° C. This post-exposure baking process promotes decomposition by acid of a polymer component present in the chemically amplified resist. In other words, the decomposition of a compound capable of being decomposed by acid contained in the chemically amplified resist progresses. Then, a development process is performed for 60 seconds using an aqueous alkaline developer. Resist pattern 6 without footing or scumming is formed (see FIG. 1e).

In accordance with the first embodiment, before application of the chemically amplified resist, semiconductor substrate 1 having a basic surface is dipped into acid solution 7. Then, acid solution 7 is dried. As a result, the basic surface of semiconductor substrate 1 is neutralized, so that resist pattern 6 without footing or scumming can be formed.

EMBODIMENTS 2–8

In place of the first embodiment's acid solution, the following acid solutions, as shown in TABLE 1, were prepared and used in the second to eighth embodiments of the present invention. Like the first embodiment, semiconductor substrate's 1 surface was neutralized for pattern formation.

TABLE 1

| EXAMPLE 2 | oxalic acid | 10 wt % |
| | 2-methoxypropanol | 90 wt % |
| EXAMPLE 3 | methanesulfonic acid | 5 wt % |
| | butyl acetate | 95 wt % |
| EXAMPLE 4 | propionic anhydride | 10 wt % |
| | diethylene glycol dimethylether | 90 wt % |
| EXAMPLE 5 | acetic acid | 5 wt % |
| | propylene glycol monomethyl ether acetate | 95 wt % |
| EXAMPLE 6 | p-toluenesulfonic acid | 7 wt % |
| | 2-heptanone | 93 wt % |
| EXAMPLE 7 | monochloroacetic acid | 15 wt % |
| | ethyl lactate | 85 wt % |
| EXAMPLE 8 | acrylic acid | 10 wt % |
| | propylene glycol monomethyl ether acetate | 90 wt % |

Like the first embodiment, each of the second to eighth embodiments was found to be able to form an adequate pattern without footing or scumming.

EXAMPLE 9

Referring now to FIGS. 2a–e, a fine-pattern formation method of the ninth embodiment of the present invention is described below. The ninth embodiment is directed in a method in which a fine pattern is formed on semiconductor substrate 1 without a basic film on its surface.

First, 5 percent by weight of diphenyldisulfone is dissolved in propylene glycol monoethyl ether acetate, to obtain acid generator solution 10, i.e., a disulfone solution containing acid generator 11. Next, acid generator solution 10 is drip-fed to semiconductor substrate 1 whose uppermost surface layer is formed by silicon, so that the entire surface of semiconductor substrate 1 is dipped into acid generator solution 10 (see FIG. 2a). Thereafter, acid generator solution 10 is spin-dried. As a result, part of acid generator 11 of diphenyldisulfone contained in acid generator solution 10 is left on semiconductor substrate's 1 surface (see FIG. 2b).

Figure 2:
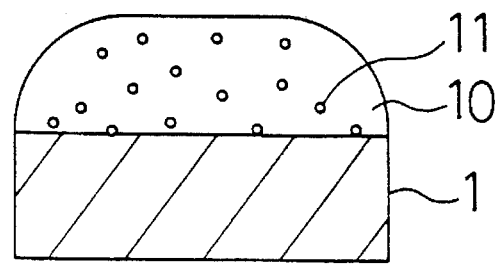
FIGS. 2a–e show in cross section steps of the fine-pattern formation method according to the ninth to fifteenth embodiments of the present invention.
Figure 2:
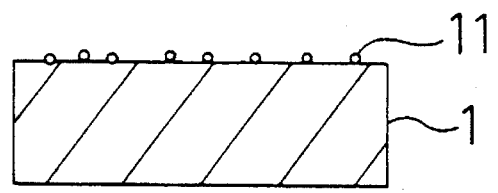
Figure 2:
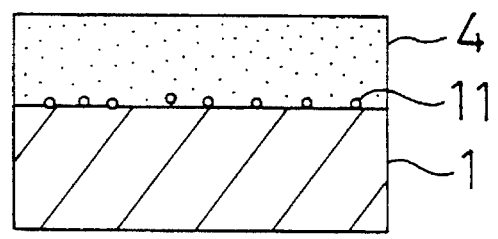
Figure 2:
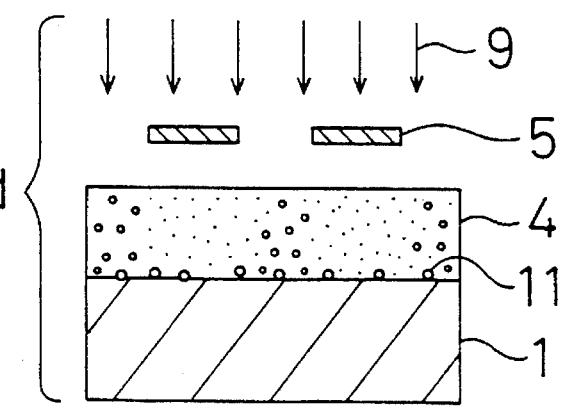
Figure 2:
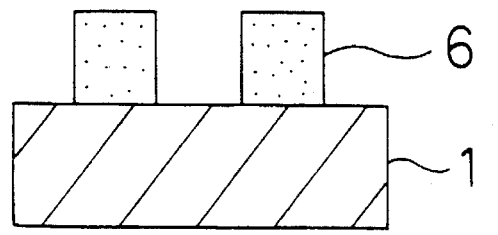

Next, as shown in FIG. 2c, a two-component chemically amplified resist of positive type, e.g., WKR-PT-2 manufactured by Wako Pure Chemical Industries Ltd., is spin-applied onto the semiconductor substrate 1. Then, a prebaking process is carried out for 90 seconds at a temperature of 90° C. to form resist film 4. In this way, resist film 4 is formed in such a way that the concentration of acid generator 11 is high only in the surface of semiconductor substrate 1.

Next, as shown in FIG. 2d, resist film 4 is exposed to KrF excimer laser 9 through mask 5. In the exposed areas, an acid is generated from the acid generator in the resist film 4 and the acid generator 11. This is followed by a post-exposure baking process for 90 seconds at a temperature of 100° C. This post-exposure baking promotes decomposition by acid of a polymer component present in the chemically amplified resist. In other words, the decomposition of a compound capable of being decomposed by acid contained in the chemically amplified resist progresses. Then, a development process is performed for 60 seconds using a developer (TMAH: 2.38 percent). Resist pattern 6 without footing or scumming is formed (see FIG. 2e).

In accordance with the ninth embodiment, before forming resist film 4 by application of a chemically amplified resist, semiconductor substrate's 1 surface is processed using acid generator solution 10. As a result of such treatment, resist pattern 6 free from footing or scumming can be obtained.

EMBODIMENTS 10–15

In the tenth to fifteenth embodiments of the present invention, the acid generator of the ninth embodiment is replaced with the following acid generator solutions as shown in TABLE 2. As in the ninth embodiment a fine-pattern is formed by each of the tenth to fifteenth embodiments.

TABLE 2

| EXAMPLE 10 | triphenylsulfonium methanesulfonate | 5 wt % |
| --- | --- | --- |
| EXAMPLE 17 | propylene glycol monomethyl ether acetate | 95 wt % |
| EXAMPLE 11 | p-toluenesulfonic acid o-nitrobenzyl | 7 wt % |
| EXAMPLE 18 | diethylene glycol dimethylether | 93 wt % |
| EXAMPLE 12 | bis(p-chlorophenylsulfonyl) diazomethane | 15 wt % |
| EXAMPLE 19 | 3-methoxy methyl propionate | 85 wt % |
| EXAMPLE 13 | 1,3,5-tris (trifluoromethane sulfonyl)benzene | 10 wt % |
| EXAMPLE 20 | butyl acetate | 90 wt % |
| EXAMPLE 14 | diphenyl-p-methylphenacylsulfonuim p-toluenesulfonate | 8 wt % |
| EXAMPLE 21 | methyl pyruvate | 92 wt % |
| EXAMPLE 15 | 2-chloro-6(trichloromethyl) pyridine | 5 wt % |
| EXAMPLE 22 | ethyl lactate | 95 wt % |

Like the ninth embodiment, each of the tenth to fifteenth embodiments was found to be able to provide an adequate pattern without footing or scumming.

EXAMPLE 16

Figure 3A:
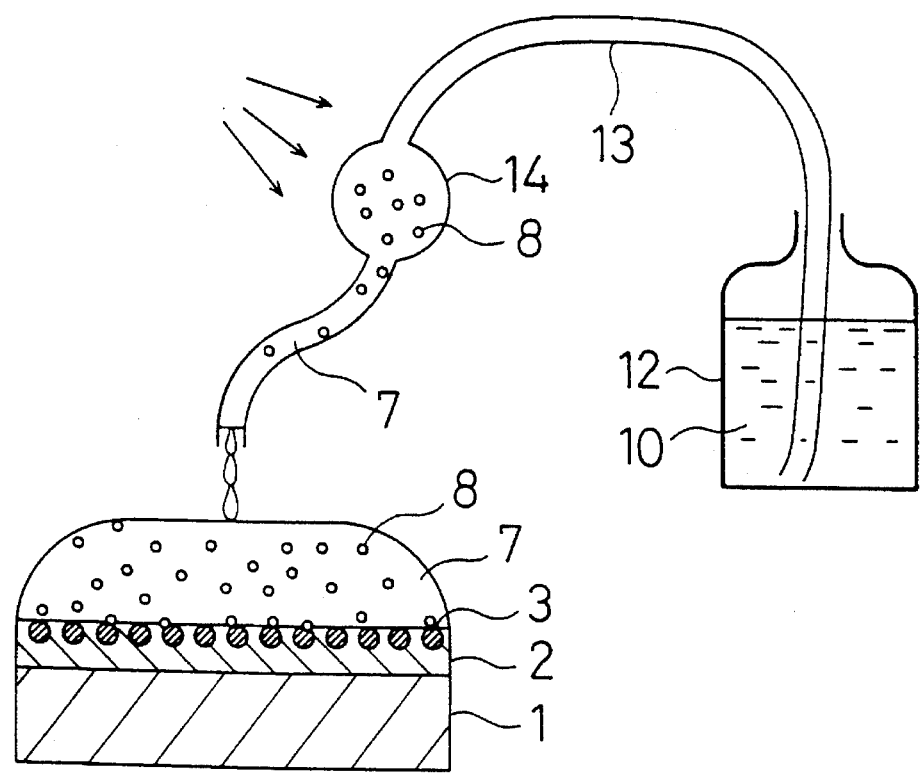
FIGS. 3a–b show in cross section steps of the fine-pattern formation method according to the sixteenth to twenty-second embodiments of the present invention.
Figure 3B:
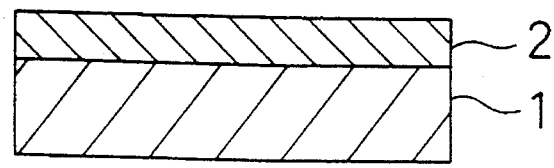
Figure 4A:
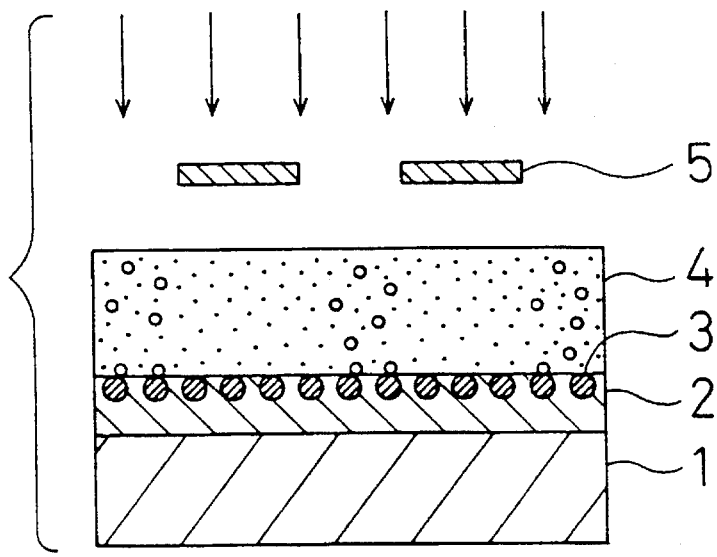
FIGS. 4a–b show in cross section steps of a conventional fine-pattern formation method.
Figure 4B:
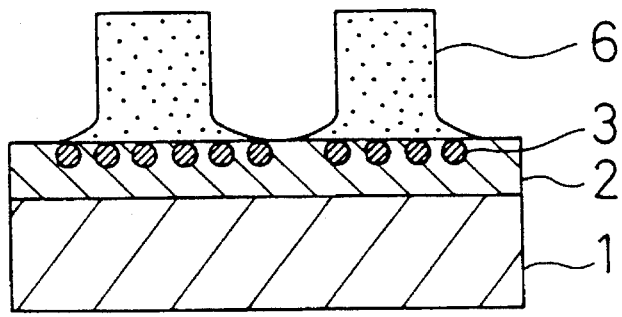

Referring now to FIGS. 3a–b, a fine-pattern formation method according to the sixteenth embodiment will be described below.

Like the first embodiment, the sixteenth embodiment discloses a fine-pattern formation method in which a fine pattern is formed over semiconductor substrate 1 with TiN film 2 on its surface.

As in the first embodiment, Tin film 2 is formed on top of semiconductor substrate 1. TiN film's 2 surface is basic because of the existence of the base 3 therein.

Next, as in the ninth embodiment, 5 percent by weight of diphenyldisulfone is dissolved in propylene glycol monoethyl ether acetate, to obtain acid generator solution 10, i.e., a disulfone solution containing acid generator 11. The obtained acid generator solution 10 is held in container 12. From container 12, acid generator solution 10 is drip-fed onto TiN film 2 through solution feed pipe 13. Solution feed pipe 13 has a section 14 for trapping acid generator solution 10. This section 14 is irradiated with deep UV radiation. Because of this, the acid generator 11 present in the acid generator solution 10 produces acid 8 and acid solution 7 containing acid 8 is fed to TiN film's 2 surface.

Acid solution 7 is drip-fed to semiconductor substrate 1, so that the entire surface of semiconductor substrate 1 is dipped into acid solution 7. Then, acid solution 7 is spin-dried. As a result, the base 3 present in TiN film 2 reacts with acid 8 contained in acid solution 7 and is neutralized, so that TiN film 2 with its surface neutralized is obtained (see FIG. 3b).

Next, like the first embodiment, a two-component chemically amplified resist of positive type, e.g., WKR-PT-2 manufactured by Wako Pure Chemical Industries Ltd., is spin-applied on TiN film 2. Then, a prebaking process is carried out for 90 seconds at a temperature of 90° C. to form a resist film. Then, the resist film is exposed to KrF excimer laser. This is followed by a post-exposure baking process for 90 seconds at a temperature of 100° C. This post-exposure baking promotes decomposition by an acid of a polymer component within the chemically amplified resist material. Then, a development process is performed using an aqueous alkaline developer. Resist pattern without footing or scumming is formed.

In accordance with the sixteenth embodiment, acid generator solution 10 is irradiated with deep UV radiation, thereby producing acid to obtain acid solution 7. Thereafter, semiconductor substrate 1 is dipped into acid solution 7 for neutralization. As a result of such treatment, it is possible to form an adequate pattern free from footing or scumming, without being affected by the basic of semiconductor substrate's 1 surface.

EMBODIMENTS 17–22

In place of the acid generator of the sixteenth embodiment, the solutions as shown in TABLE 2 were prepared and a pattern was formed in the same way as in the sixteen embodiment. Each embodiment was found to be able to provide an adequate pattern without skirt trailing.

The first to eighth, and sixteenth to twenty-second embodiments are described in the case where a film of TiN is the uppermost film. However, the present invention may be applicable in any semiconductor substrate with a basic surface, e.g., a semiconductor substrate with an inorganic (or organic) film on its surface.

The present invention may be applicable in a semiconductor substrate having a non-basic surface when it is contaminated by a trace amount of environmental impurity present in a clean room. Footing or scumming and undercutting are prevented.

In each embodiment of the present invention, an acid solution is fed if a semiconductor substrate has a basic surface, while an acid generator solution is fed if a semiconductor substrate has a non-basic surface, which is not to be considered restrictive. However, it is preferable to neutralize the entire surface of a semiconductor substrate beforehand by feeding an acid solution thereto. Further, it is preferable, if a semiconductor substrate has a non-basic surface, to feed an acid generator solution for producing acid in exposed areas only. As a result, the chemically amplified resist is less ill-affected by acid.

Further, in each embodiment of the present invention, the WKR-PT-2 is used. However, any chemically amplified resist may be used as long as its solubility changes by acid catalytic reaction. For example, other two-component positive-type resists, e.g., CAMP6 manufactured by OCG, and three-component positive-type resists, e.g., DX46 manufactured by Hoechst or other negative-type resists, e.g., XP8843 manufactured by Shipley may be useful.

The invention claimed is:

1. A method for forming a fine pattern comprising:
    a first step for feeding an acid solution onto a semiconductor substrate;

a second step for coating said semiconductor substrate with a chemically amplified resist containing an acid generator which produces an acid when irradiated with radiant rays, and a compound reactive to an acid, to form a resist film;

a third step for sending radiant rays upon said resist film to expose same; and a fourth step for developing said exposed resist film to form a resist pattern.

2. A method for forming a fine pattern according to claim 1 wherein said first step includes a step in which a solution of an acid generator capable of producing an acid when irradiated with radiant rays or when heated is irradiated with radiant rays or heated to produce an acid for transforming said acid generator solution into an acid solution while at the same time feeding said acid solution onto said semiconductor substrate.

3. A method for forming a fine pattern according to claim 1 wherein said acid solution in said first step contains at least one of organocarboxylic acid, organocarboxylic acid anhydride, organodicarboxylic acid, and organosulfonic acid.

4. A method for forming a fine pattern according to claim 1 wherein a basic film is formed on a surface of said semiconductor substrate surface in said first step.

5. A method for forming a fine pattern comprising:

a first step for feeding an acid generator solution containing an acid generator capable of producing an acid when irradiated with radiant rays, onto a semiconductor substrate;

a second step for coating said semiconductor substrate with a chemically amplified resist containing an acid generator which produces an acid when irradiated with radiant rays, and a compound reactive to an acid, to form a resist film;

a third step for sending radiant rays upon said resist film for causing said acid generator contained in said acid generator solution to produce an acid and exposing said resist film; and a fourth step for developing said exposed resist film to form a resist pattern.

6. A method for forming a fine pattern according to claim 5 further comprising a step between said first step and said second step in which said acid generator contained in said acid generator solution is irradiated with radiant rays to produce an acid.

7. A method for forming a fine pattern according to claim 5 wherein:

said acid generator in said first step is capable of producing an acid when heated; and said fine-pattern formation method further comprises a step between said second step and said third step or between said third step and said fourth step in which said semiconductor substrate is heated so that said acid generator contained in said acid generator solution produces an acid and said resist film is baked.

8. A method for forming a fine pattern according to claim 5 wherein said acid generator solution in said first step further contains an acid compound.

9. A method for forming a fine pattern according to claim 5 wherein a basic film is formed on a surface of said semiconductor substrate in said first step.

10. A method for forming a fine pattern comprising:

a first step for feeding an acid generator solution containing an acid generator capable of producing an acid when heated, onto a semiconductor substrate;

a second step for coating said semiconductor substrate with a chemically amplified resist containing an acid generator which produces an acid when irradiated with radiant rays, and a compound reactive to an acid, to form a resist film;

a third step for heating said semiconductor substrate to cause said acid generator contained in said acid generator solution to produce an acid and to bake said resist film;

a fourth step for sending radiant rays upon said baked resist film to expose same; and a fifth step for developing said exposed resist film to form a resist pattern.

11. A method for forming a fine pattern according to claim 10 further comprising a step between said first step and said second step in which said semiconductor substrate is heated so that said acid generator contained in said acid generator solution produces an acid.

12. A method for forming a fine pattern according to claim 10 wherein said acid generator solution in said first step further contains an acid compound.

13. A method for forming a fine pattern according to claim 10 wherein a basic film is formed on a surface of said semiconductor substrate in said first step.

14. A method for forming a fine pattern comprising:

a first step for feeding an acid generation solution containing an acid generator capable of producing an acid when heated, onto a semiconductor substrate;

a second step for coating said semiconductor substrate with a chemically amplified resist containing an acid generator which produces an acid when irradiated with radiant rays, and a compound reactive to an acid, to form a resist film;

a third step for sending radiant rays upon said resist film to expose same;

a fourth step for heating said semiconductor substrate to cause said acid generator contained in said acid generator solution to produce an acid and to bake said resist film; and a fifth step for developing said baked resist film to form a resist pattern.

15. A method for forming a fine pattern according to claim 14 further comprising a step between said first step and said second step in which said semiconductor substrate is heated so that said acid generator contained in said acid generator solution produces an acid.

16. A method for forming a fine pattern according to claim 14 wherein said acid generator solution in said first step further contains an acid compound.

17. A method for forming a fine pattern according to claim 14 wherein a basic film is formed on a surface of said semiconductor substrate in said first step.

18. A method for forming a fine pattern comprising:

a first step for feeding an acid solution onto a semiconductor substrate with a basic surface;

a second step for feeding an acid generator solution containing an acid generator capable of producing an acid when irradiated with radiant rays, onto said semiconductor substrate;

a third step for coating said semiconductor substrate with a chemically amplified resist containing an acid generator which produces an acid when irradiated with radiant rays, and a compound reactive to an acid, to form a resist film;

a fourth step for sending radiant rays upon said resist film for causing said acid generator contained in said acid generator solution to produce an acid and exposing said resist film; and a fifth step for developing said exposed resist film to form a resist pattern.

19. A method for forming a fine pattern according to claim 18 wherein:

said acid generator in said second step is capable of producing an acid when heated; and said fine-pattern formation method further comprises a step between said third step and said fourth step or between said fourth step and said fifth step in which said semiconductor substrate is heated so that said acid generator contained in said acid generator solution produces an acid and said resist film is baked.

* * * * *